United States Patent

[19]

Olive

[11] 3,980,948

[45] Sept. 14, 1976

[54] SYSTEM AND PROCESS FOR LOCATING SOURCES OF RADIATION

[76] Inventor: George A. Olive, 229 Mill Run Court, Moorestown, N.J. 08057

[22] Filed: June 17, 1974

[21] Appl. No.: 480,106

[52] U.S. Cl. .............................. 324/83 D; 324/83 R; 343/113 R
[51] Int. Cl.² .......................................... G01R 25/00
[58] Field of Search ....................... 324/83 R, 83 D; 343/113 R

[56] References Cited
UNITED STATES PATENTS

| | | | |
|---|---|---|---|
| 3,469,196 | 9/1969 | Cowin et al. | 324/83 D |
| 3,600,690 | 8/1971 | White | 324/83 D |
| 3,622,879 | 11/1971 | Girouy | 324/83 D |
| 3,764,903 | 10/1973 | Griswold | 324/83 D |
| 3,820,022 | 6/1974 | Watt | 324/83 D |
| 3,863,258 | 1/1975 | Clark | 324/83 D |

Primary Examiner—R. V. Rolinec
Assistant Examiner—Michael J. Tokar
Attorney, Agent, or Firm—Charles F. Duffield

[57] ABSTRACT

A vehicle location system is provided for determining the coordinate location of a vehicle through radio transmission radiation from the vehicle and the system includes a plurality of receiver sites at known coordinate locations each having antenna-coupler means providing first and second signals whose phase difference is approximately linearly related to the azimuth angle of the receiver signal from the radiation source. The first and second signals are processed at each receiver site to translate the frequency of the signals to a lower frequency and to remove the common frequency variations therefrom. Thereafter, the signals are passed through a phase detector which provides a binary output expression which is linearly related to the phase difference between the first and second signals. The binary expressions from each of the respective receiver sites are then processed through an electronic data processing means which is programed to determine the coordinates of the radiation source from the plurality of the binary expressions.

3 Claims, 7 Drawing Figures

SYSTEM AND PROCESS FOR LOCATING SOURCES OF RADIATION

BACKGROUND OF THE INVENTION

The present invention is concerned with vehicle location systems and, more specifically, to vehicle location systems which utilize a radio transmission radiation as the operative means in the location process and is a division of Ser. No. 336,409, filed Feb. 28, 1973.

There is an ever increasing number of vehicles such as police cars, boats and aircraft which are utilizing radio transceivers. Controllers or dispatchers at ground locations, which are in communication with these various vehicles, need to know the coordinate location of the vehicle to carry out their responsibilities such as, for example, coordination of the operation of two or more vehicles, traffic control and rendering aid in distress situations.

In a great number of situations, where the particular vehicle is transmitting, the operator of the vehicle will not know of his exact location or will be unable to relate the location to the ground control station. Accordingly, a vehicle location system is required which can establish the coordinate location of the transmission source based upon the existence of the transmission itself without any location assistance from the particular vehicle operator making the transmission.

Vehicle location systems of the type which determine coordinates of the radiation source from the radiation signal itself have been proposed and built. These systems, however, suffer a common problem of reliability and accuracy in the coordinate determination. One such problem is the drift or variation of various receiving sites due to temperature changes and aging of the components which requires continuous recalibration and updating by ground personnel. A further problem, which is most prominent in ground transmissions, is the effect of multipath or reflected radiation of the signal which produces ambiguous coordinate determinations.

OBJECTS AND SUMMARY OF INVENTION

It is an object of the present invention to provide a vehicle location system of the type which utilizes the radio transmission radiation for the purpose of determining the coordinate location of the source of the radiation and which is of a more reliable and accurate operation.

It is a further object of the present invention to provide a vehicle location system, operating upon the radio transmissions of the vehicle, for location of the vehicle in which the problems of inaccuracies due to temperature and aging of the components are alleviated by a means within the system to automatically recalibrate the system.

It is yet a further object of the present invention to provide a vehicle location system utilizing radio transmission signals for location of the vehicle which, by the manner in which the signals are processed, alleviates the problem of multipath.

The foregoing objects are carried out by the present invention by the utilization of a plurality of receiver sites at known coordinate locations. Each of the receiver sites employs an antenna-coupler means which provides first and second output signals whose phase difference is approximately linearly related to the azimuth angle of the received signal from the radiation source.

The resultant first and second signals are passed through a signal processor at each receiver site which utilizes a first mixing device which has as its first input the first signal and as its second input the output of a local oscillator which also provides the first output of the signal processing means. The difference output from the first mixer provides one of the inputs to a second mixing device which has as its other input the second signal. The resultant output from the second mixing device is chosen as the difference signal. This arrangement removes the common frequency variations from the first and second signals such as carrier drift and modulation and the resultant two output signals differ only by the phase shift between the two signals which is representative of the azimuth angle of the received signal from the radiation source.

The resultant output signals from the signal processing means are then passed to a phase detector means which is gated to operate over a predetermined number of cycles of the signal and which utlizes the phase difference between the first and second signals to operate a binary counter whose output will be linearly related to the phase difference between the first and second signals. Means are provided in the phase detector to sense when the signals are below a usable value to restart the count. Additionally, means are provided in the phase detector to determine when the first and second signals are near a coincidence point and to delay one of the signals to remove possible gating ambiguity and then to remove the effect of the delay by an offset count.

The binary output from the phase detector for each receiving site is passed to an electronic data processing means which is programmed to store the binary expressions from the respective receiver sites for recall. The data processing means is programmed to first recall selected receiver sites to make an approximate coordinate determination. Thereafter, the data processor chooses certain subsets of receiver sites providing the best coordinate determination based upon the approximate coordinate determination and then makes an exact coordinate determination. The coordinate determination may be displayed on a location display unit representative of the geographic area within which the vehicle is operating.

One of more fixed transmitting sites, at known coordinate locations, are provided in the geographic area of the receiver sites. The data processing means is programmed to periodically initiate a transmission from the known transmission sites. The coordinate location of the known transmitters is programed into the data processing means and the resultant azimuth angle determinations made by the receiver sites, as represented by the binary expressions, are compared to the stored binary expressions representative of the known azimuths of the transmission sites. Where there is a difference, the computer program is updated or recalibrated to compensate for the difference which may be due to such factors as temperature changes and aging of the components.

Other objects and advantages of the present invention will become apparent to those skilled in the art from the detailed description thereof which follows taken in conjunction with the drawings.

DETAILED DESCRIPTION OF INVENTION

Figure 1:
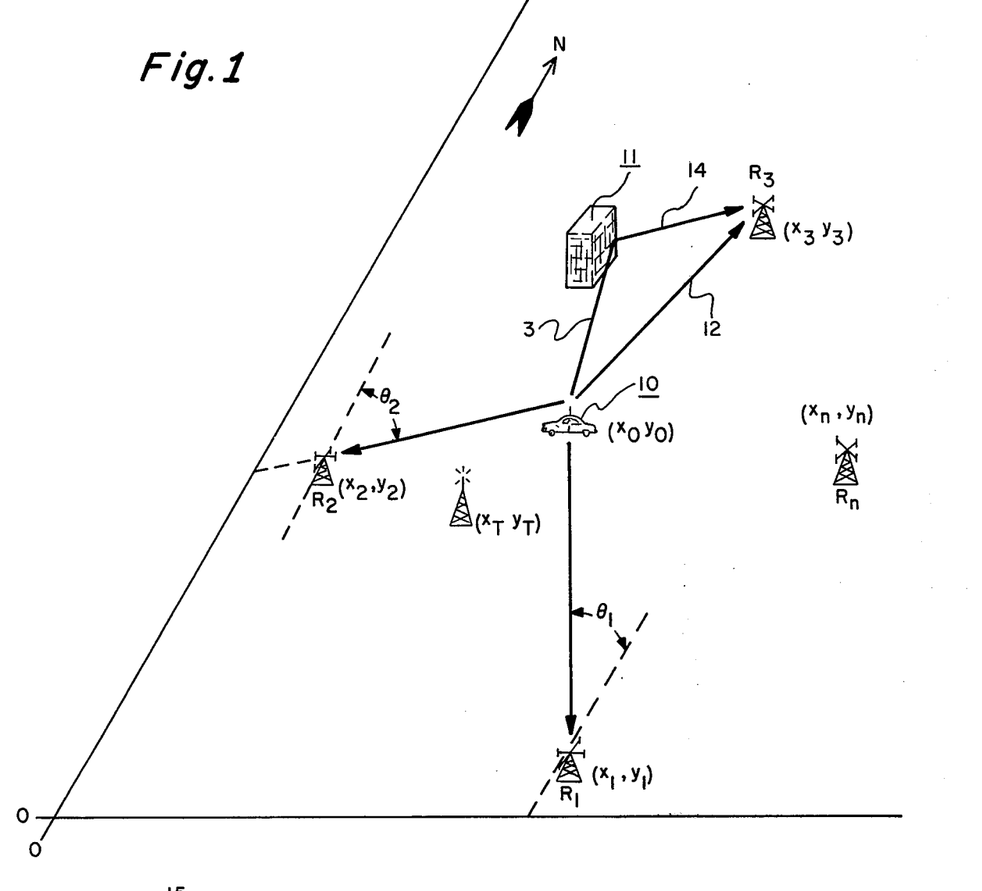
FIG. 1 is a pictorial view of the geographic area of certain components involved in the vehicle location system of the present invention.

The vehicle location system of the present invention, in overall concept, is shown pictorially in FIG. 1 of the drawings. The system includes a plurality of fixed receiving stations $R_1$, $R_2$, $R_3$ ... $R_n$, positioned at various desired locations around the area within which the position of respective automobiles is to be determined. Each of the receiving sites are at known coordinate locations i. e., $(x_1, y_1)$ etc.

Assume for the moment that a vehicle 10, whose coordinate location $(x_0, y_0)$ is unknown, has just transmitted a message. The transmission will be received by all receivers. In accordance with the present system, and as to be explained in detail hereinafter, the received signal at each of the receivers will be processed to determine the azimuth angle $\theta_1, \theta_2, \theta_3 \ldots \theta_n$ for each of the respective receiver sites. Once the azimuth angles are determined, the exact location $(x_0, y_0)$ of the vehicle which issued the transmission is then determined.

One of the problems which arises in respect to such coordinate determination, which the present vehicle location system minimizes, is the effect of multipath. The occurrence of multipath is illustrated in FIG. 1. Where there is the presence of obstructions such as buildings 11, the transmitted signal will include two paths, the first the direct path 12 to the receiver $R_3$ as well as the reflected path 13–14 to the receiver $R_3$. The result is a confused or erroneous azimuth determination from the receiver $R_3$. The elimination of this problem will be discussed more in detail later.

Figure 2:
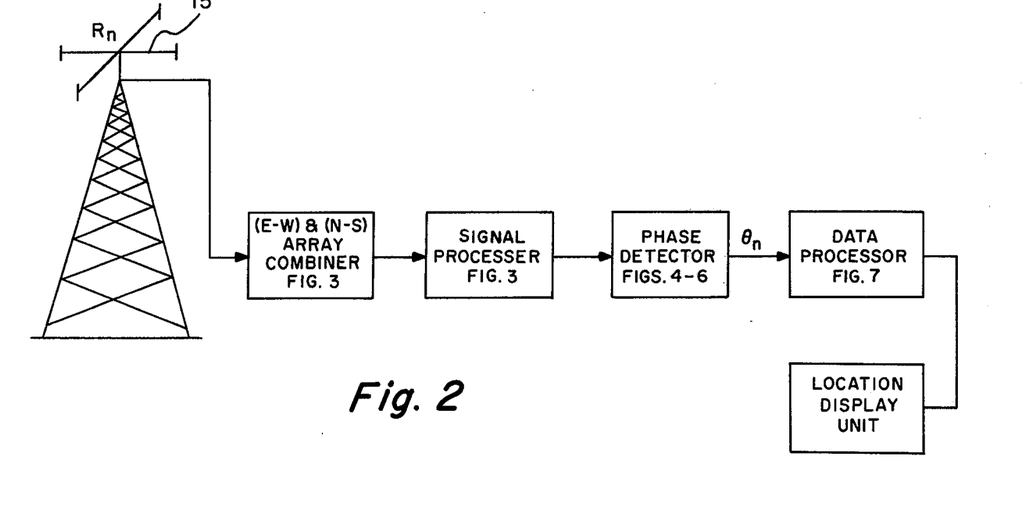
FIG. 2 is a pictorial view and block diagram of the major component assemblies involved in the vehicle location system.

The overall components of the vehicle location system are shown in the flow diagram of FIG. 2. In general and as will be described in detail hereinafter, the system employs a four element antenna 15. The output of the antenna 15 is passed through a combiner (FIG. 3) with a resultant two output signals whose phase differs with the azimuth of the received signal at the antenna.

Figure 3:
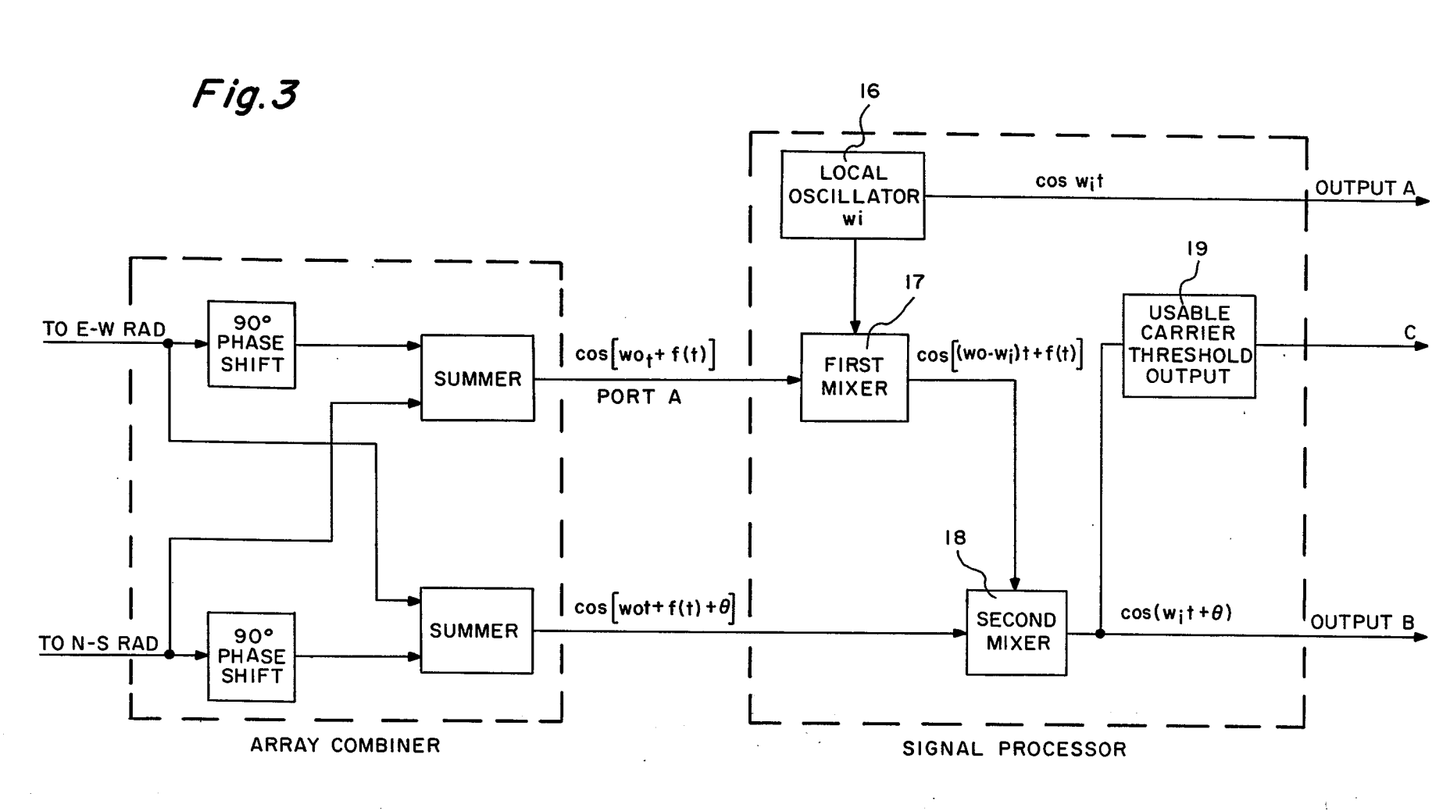
FIG. 3 is a block diagram of the antenna array combiner and signal processor of the present invention.

The two output signals from the antenna combiner are passed through a signal processor shown in detail in FIG. 3. In the signal processor, carrier modulation and carrier drift are removed. Additionally, the frequency of the signals is reduced without affecting the single valued functional relationship existing between the signal phase differences indicative of the azimuth of the radiation source.

Figure 4:
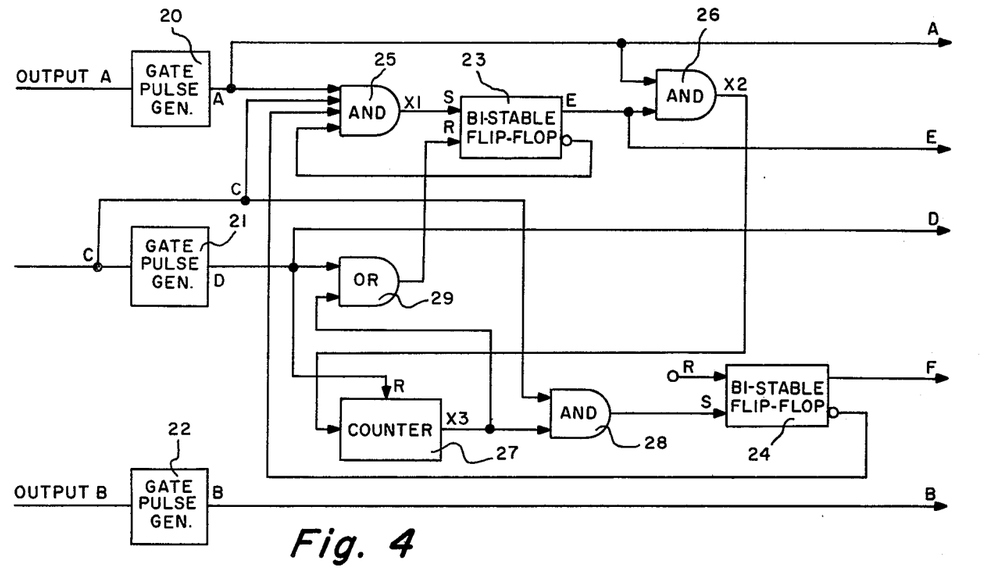
FIGS. 4 and 5 are schematic diagrams of the phase detector of the present invention.
Figure 5:
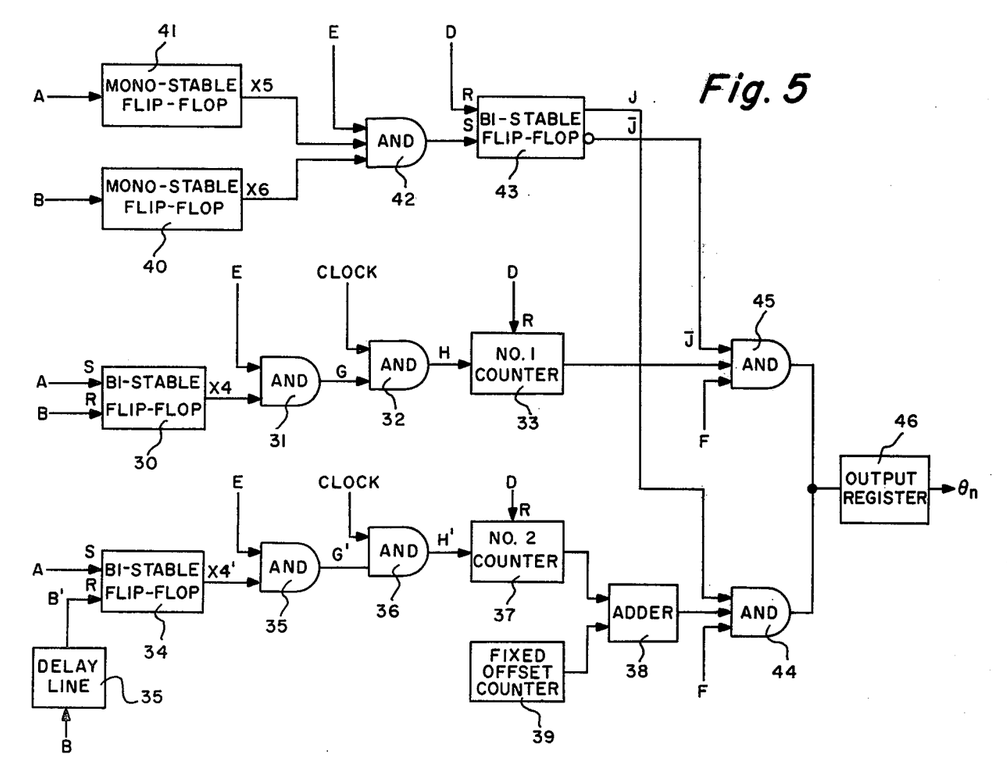
Figure 6:
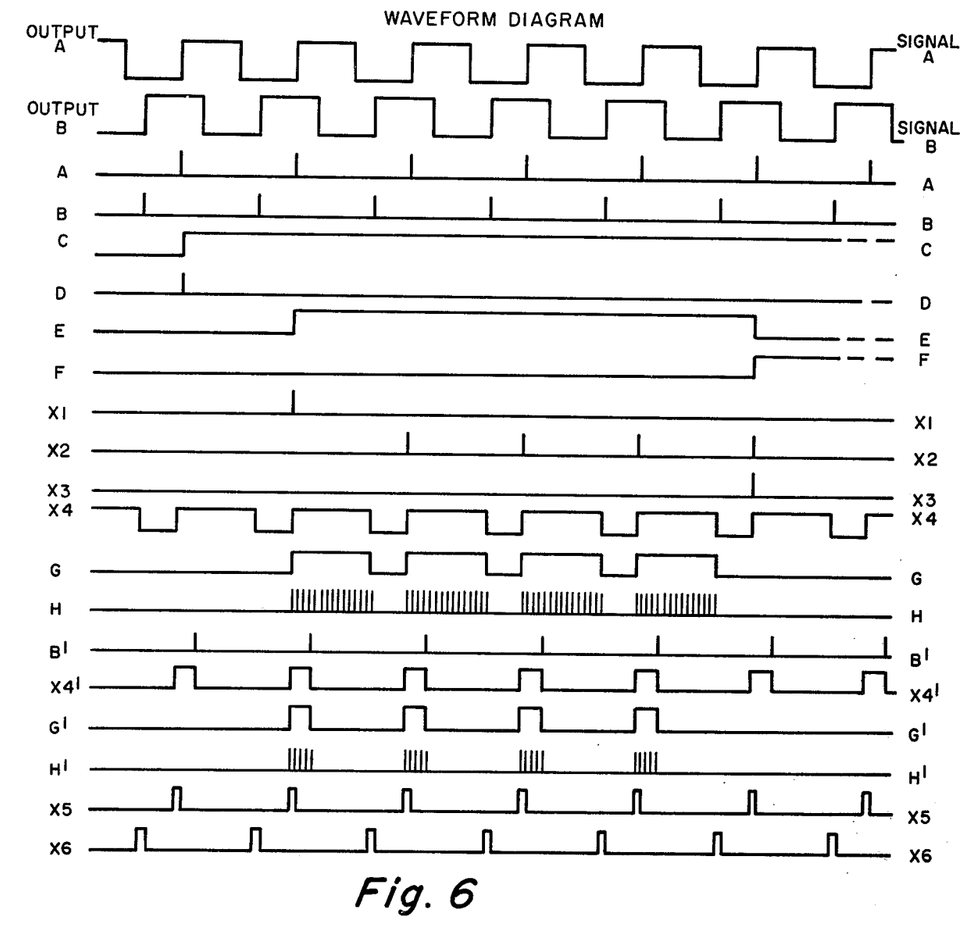
FIG. 6 is a wave form diagram of the wave forms generated in the phase detector of FIGS. 4 and 5.

The signals from the signal processor are then passed to a phase detector illustrated in FIGS. 4–6 of the drawings. The phase detector measures the phase difference between the two signals and represents this phase by a numeric count. The phase detector includes circuitry therein which is responsive to phase angle measurements close to 360° to establish an offset counting procedure to remove the possible ambiguity. The phase measurements are stored in binary registers until called for by the data processor.

The data processor, described in more detail hereinafter in reference to FIG. 7, includes means for sequentially receiving the various azimuth angle measurements from the respective receiver sites. The data processor makes an approximate determination of the coordinates of the vehicle. Thereafter, the data processor selects the best receiver sites for the most accurate coordinate determinations and then reprocesses the selected azimuth determinations to arrive at the exact coordinate location. The data processor also includes provisions for data updating and recalibration by utilizing a remote fixed transmitter as hereinafter described. Lastly, the exact coordinate location is then displayed on a location display unit.

The antenna and combiner system employed in the vehicle location system of the present invention is shown in FIGS. 2 and 3 of the drawing. The antenna is an omnidirectional, vertically polarized antenna of the Adock or super turnstile design. Typically, the antenna includes a pair of east-west radiators and a pair of north-south radiators. Each array is disposed at right angles to the other array and at intersecting angles with the center of the array. The wave length spacing between the monopole or dipole elements of each array is approximately one-half wave length and the radiators of each array are harnessed in phase opposition. Such an antenna 15 is pictorially shown in FIG. 2.

The output of the east-west and north-south radiators from the antenna are combined in an array combiner illustrated in block diagram in FIG. 3. The signals are combined such that feeds from port A and port B are derived from the north-south and east-west signals in phase quadrature.

The resultant combined signals provide an output at port A and port B wherein the carrier phase of one of the outputs increases with the azimuth of the received signal while the carrier phase decreases with azimuth at the other output. The resultant phase difference between the two outputs of the antenna-coupler arrangement is a measure of the azimuth of the received signal.

Antenna-coupler arrangements employed in the vehicle location system of the present invention and above described are in common use and the operation thereof well known by those skilled in the art. For a more comprehensive and detailed description of the structure and operation of such antennas and couplers, reference is made to Radio Engineers Handbook, Keith Henney, McGraw-Hill, 1959, chapter 26.

The two outputs from the array combiner both include the common frequency variations of carrier drift and frequency modulation. The comparison and measurement of the phase difference between the two signals will be complicated and confused by the frequency variations unless they are removed. The signal processor of the present invention removes the common modulation and carrier drift from the signal while leaving intact the phase difference of the signals.

The signal processor utilized in the vehicle location system of the present invention in which the frequency variations are removed is shown in FIG. 3. It is to be noted that the outputs from the array combiner are identical, as indicated in FIG. 3, except for the phase difference $\theta$. The carrier angular frequency $w_0$ and the modulation function $f(t)$ are the same.

The signal processor includes a local oscillator 16 operating at a frequency $w_i$. The local oscillator 16 provides the first output function A $\cos(w_{it})$ from the signal processor. Additionally, the local oscillator provides the first input to the first mixer 17.

The second input to the first mixer 17 is the output from port A of the combiner. The first mixer, as well as the second mixer to be hereinafter described, are of the well known design of circuit which generates an output signal having an intermediate frequency differing from but linearly related to the frequencies of the two input signals. In the mixer configuration contemplated, the two output frequencies are either the sum or difference of the two input frequencies. The output wave selected from the first mixer is the frequency equal to the difference between the first and second mixer inputs, in this case $w_o-w_i$. The resultant output function which is selected is shown in FIG. 3 and it is to be noted that the output of the first mixer still includes the modulation function $f(t)$.

A second mixer 18 is employed in the signal processor. The inputs to the second mixer are the output of the first mixer 17 and the output at port B from the array combiner. The output wave having a frequency equal to the difference between the second mixer input frequencies, $w_o-w_i$ and $w_o$ is selected as the second mixer output. The resultant output function is $\cos(w_{it}+\theta)$. The modulation function $f(t)$ was removed in the second mixer and the second resultant output B is linearly related to the first output A differing only by the difference in the phase between the two input signals.

The signal processor shown in FIG. 3 also includes a threshold circuit 19. The threshold circuit monitors the level and value of the output carrier in output B. The threshold circuit provides an output C of a uniform high level, for a purpose as hereinafter described, so long as the value of the carrier remains at or above a usable value.

From the foregoing description it will be appreciated that the signal processor accomplishes the purpose of removing the fixed frequency variations from the two input signals and, as well, provides output signals at a lower and more manageable intermediate frequency. Various other mixer techniques may be employed to accomplish this end and are well known to those skilled in the art and, therefore, it is not deemed necessary to enter into a detailed description thereof. It is anticipated that in some applications, it may be desirable to use two frequency translation steps to arrive at the final output frequency rather than one for each signal as shown. It is also anticipated that such circuit functions as automatic gain control and selectivity would be built into the signal processor.

The output signals A and B from the signal processor which differ only by the carrier phase as well as the usable carrier signal C are applied to the phase detector shown in FIGS. 4–5. The following description of FIGS. 4 and 5 will be taken in conjunction with the signal wave form diagram shown in FIG. 6.

The phase detector is composed of essentially two subcomponent groups, the first shown in FIG. 4 and the second shown in FIG. 5. The subgroup of components shown in FIG. 4 will be discussed first. In general, the function and purpose of the circuitry of FIG. 4 is to provide an output signal E which exists for a time duration as long as the desired integration time, in the example taken involved, four carrier cycles. The circuitry of FIG. 4 is also designed to produce an output signal F which is indicative that the carrier was usable for the integration time or length of the signal E.

More specifically, output signals A and B as well as the usable carrier signal C are each applied to respective gate pulse generators 20–22 as shown in FIG. 4. The gate pulse generators 20–22 are essentially differentiating circuits which produce a gating pulse or spike upon the occurrence of the positive going signal applied to the generator. The resultant wave forms from the gate pulse generators (A, B and D) are shown in the wave form diagram in FIG. 6.

At the beginning of the operation of the circuitry shown in FIG. 4, both bistable flip-flops 23 and 24 have been reset to a low at the noninverting output and a high at the inverting output. The inverted output of both flip-flops are applied to a four input AND gate 25. A third input to the AND gate 25 is the signal C indicating a usable carrier. The fourth input to the AND gate 25 is the gating pulse A. When all four signals are present, the AND gate 25 will pass the first gating pulse A after the other three inputs are received to the AND gate. The resultant output $X_1$ is a gating pulse or spike which reverses the outputs of the flip-flop 23 and provides the signal E.

Signal E is also applied as one of the inputs to a two input AND gate 26. The other input to AND gate 26 is the A pulses which are occurring with each positive going carrier signal, as shown in the wave form diagram in FIG. 6. AND gate 26 will pass the A pulses to a counter 27.

Counter 27 is set to count up to a predetermined count and then deliver a gating pulse. In the example in FIG. 4, the counter is set to count to a four count indicating integration of four cycles before delivering a gating pulse. When the four count is reached, the gating pulse, $X_3$, is applied through AND gate 28 to the set input of bistable flip-flop 24. The other input of AND gate 28 is the C signal indicating the presence of a usable carrier signal. The gating pulse $X_3$, when applied to the set input of flip-flop 24, reverses the flip-flop applying a high output signal F at the noninverting output of the flip-flop.

Counter 27, upon counting out and producing the $X_3$ signal, also applies this signal to OR gate 29. The output of the OR gate 29 is applied to the reset input of the flip-flop 23 and resets the flip-flop to a high inverted output and drops the E output to a low level.

If the carrier is not of a usable value, then the C signal will not be present and the necessary input to AND gate 25 will likewise not be present and the integration cycle will not occur until the presence of the usable signal. On the other hand, if the integration cycle has commenced with the presence of a signal C indicating a usable carrier and thereafter the signal falls below a usable value, then signal C will disappear and AND gate 28 will not be enabled at the end of the count thus preventing the signal F from being generated. Further, the counter will generate the $X_3$ signal and reset flip-flop 23 which will rest until the reappearance of a C signal at AND gate 25.

Assume now that the C signal, indicative of the useful carrier, has disappeared during the integration cycle and then reappears before the end of the count. In this case, the C signal will be differentiated in the gate pulse generator 21 and a gating pulse D generated. Pulse D will pass through OR gate 29 and reset flip-flop 23 to discontinue the E signal. Simultaneously, the D pulse will reset the counter 27 to zero count. Accordingly, the integration cycle will be restarted with the count in counter 27 starting upon the reappearance of the E signal.

The flip-flop 24, which provides the F signal, will be reset by the receiver interrogator at the central processing unit as hereinafter described.

Accordingly, where there has been a usable carrier for the period of the integration cycle, the circuitry of FIG. 4 will produce an E signal continuously throughout that period and also an F signal commencing at the end of that period indicative that there has been a continuous usable carrier during the integration period. If at any time the carrier dropped below the usable signal level and either stayed below that point during the remaining integration period or reappeared during the integration period, then the E and F signals would be removed and would not reappear until the carrier rose to a usable value.

The second subgroup of components in the detector are shown in FIG. 5. The cyclically reoccurring gating pulses A and B, representing the phase difference between the two signals, are applied to a bistable flip-flop 30. The output of the bistable flip-flop 30 is for a duration indicative of the phase difference between the two signals as may be seen from the wave form diagram in FIG. 6. The output from the bistable flip-flop 30 is applied to a two input AND gate 31. The other input to AND gate 31 is the E signal representative of the number of integration or carrier cycles to be utilized in the phase determination. The resultant output of AND gate 31 will be to pass as many outputs from flip-flop 30 as cycles to be involved in the count, in the example being discussed for cycles of the carrier. This may be seen from the wave form diagram as signal G shown in FIG. 6.

Signal G is, likewise, applied to a two input AND gate 32. The other input to the AND gate are the clock pulses of a clock. The output of AND gate 32 will be a series of clock pulses of a clock. The output of AND gate 32 will be a series of clock pulses during each high state of the flip-flop 30 and for as many cycles of the flip-flop as determined by signal E indicative of the cycle count. The clock pulses thus passed through AND gate 32 are counted in number 1 binary counter 33. The binary count is thus indicative of the phase angle and, in turn, indicative of the azimuth angle of the received signal.

There will be conditions at which the azimuth angle of the received signal is such that the phase of the A and B signals will be nearly coincident. As this occurs, gate pulsing might become ambiguous. This condition is detected and eliminated in the detector circuitry shown in FIG. 5.

The ambiguity, when the signals are near coincidence, is overcome by providing a second B signal, B' which differs from the B signal by a constant phase. A 180° phase difference would be convenient from a circuit design standpoint. The second B' signal is derived by applying the B signal to a delay line 35.

The second B' signal is applied to the reset of a further flip-flop 34. The A signal provides the set for the flip-flop. The resultant output $X_4'$ is applied through a two input AND gate 35 to provide a G' signal which is applied through a two input AND gate 36 and to a second counter 37 in a manner identical to the counter circuitry just described and utilized with the nondelayed B input signal.

The binary count contained in number 2 binary counter 37 is applied to an adder 38. A fixed offset counter 39 likewise applies an input to adder 38. The fixed offset counter 39 provides the correction for the altered count in number 2 counter resulting from the phase delay created by the B' signal. The binary count in adder 38 would thus be corrected to be the same as that in number 1 counter and both are indicative of the phase difference ad azimuth angle of the received signal.

The detector of FIG. 5 further includes circuitry to ascertain whether or not the A and B signals are nearly coincident thus creating the gating problem and necessity for use of the delay-offset counting procedure. This is accomlished by applying the A and B signals to a pair of monostable flip-flops 40 and 41 respectively. The outputs of the monostable flip-flops, signals $X_5$ and $X_6$, as reprsented in the wave form diagram in FIG. 6, will be signals which will be high for a predetermined period of time and then invert to a low output. The on time of the flip-flops 40 and 41 is for a small portion of the carrier cycle time. Where the phase difference between signals A and B is beyond the problem area as respects ambiguity, then the on time of the respective flip-flops 40 and 41 will not be coincident. However, where the signals are reasonably coincident, then the on times of the respective flip-flops will overlap and the outputs of the flip-flops, $X_5$ and $X_6$, will be applied in coincidence to three input AND gate 42. The other input to AND gate 42 is the E signal representative of the duration of the integrating cycle.

Where coincidence of the A and B signals occurs, AND gate 42 will produce an output to the set input of a bistable flip-flop 43. When this occurs, the noninverting input J will go high and be applied to three input AND gate 44. Simultaneously, the inverted input J̄, which in noncoincidence situations in normally high, will go low and disenable AND gate 44. The determination of the coincidence or lack of coincidence of the A and B signal will be made prior to the end of the integration cycle and, accordingly, the enabling or disenabling inputs to the AND gates 44 and 45 will be applied.

At the end of the integration cycle, there will be a count present in both number 1 counter and number 2 counter indicative of the azimuth angle of the received signal. Additionally, at the end of the integration cycle, the F signal will be generated and will be applied as a third input to both AND gates 44 and 45. Depending upon the degree of coincidence of the A and B signals, the count in either counter number 1 or counter mumber 2 will be applied to an output register 46. The count in each of the output registers 46 associated with each of the receiving sites will be held until called for by the data processor as to be described hereinafter.

Once the count has been received into the output register 46, the count will remain in the output register and the circuitry will not count further until the transmission is over and the occurrence of the next transmission signal, at whatever location, which will produce a further gating pulse which will reset number 1 and number 2 counters as well as bistable flip-flop 43 and the various circuitry set out in FIG. 4 as above described. Thereafter, a complete and new counting sequence is started to give the count and indication of the azimuth of the newly received signal. Additionally, the output register 46 will be set to zero by the central processing until after transfer of the data to the central processing unit.

It is to be recalled that there are a plurality of receiver sites and that each receiver site will determine a binary count indicative of the azimuth angle of the transmitted signal from that receiving site. These plurality of resultant azimuth readings, held in each of the output registers 46, are applied to the data processing apparatus shown in block diagram in FIG. 7. Specifically, each of the binary counts from the various rceivers are passed to a receiver interrogator and data storage unit 47.

The receiver interrogator and data storage unit 4 is located at the central station and serves to determine when the various receiver sites have made an azimuth determination. This may be accomplished by having selected ones of the receiver sites transmit a code signal indicative of having made such determinations. Typically, when the code signal is received, the interrogator will sequentially, in a predetermined order, interrogate the receiver sites and receive back from the sites the binary counts indicative of the azimuth angles which counts will be placed into the data storage for future recall.

Figure 7:
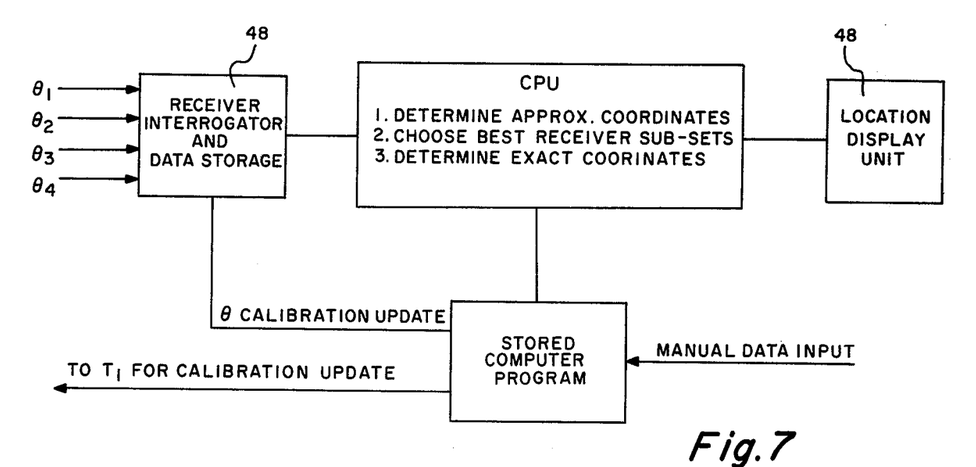
FIG. 7 is a block and flow diagram of the data processing employed in the present invention.

The data processor shown in block diagram in FIG. 7 may be a special purpose computer or, if desired, a general purpose computer appropriately programmed to operate in conjunction with the other equipment in the system. In either case, the data processing operation performed by the data processor may be broken into three major operational substeps or routines (1) means for maintaining the calibration of the system and detecting equipment failure, thus reducing or diminishing errors due to equipment drift or failure; (2) means to gather data and analyze such data to provide certain numeric constants characteristic of the system, such constants being required in the stored program of the computer; and (3) means to determine the location of the radio equipped vehicles from the radio signals, such means reducing the errors introduced by multipath propagation.

Considering the calibration routine first, from time to time, either automatically under the control of the stored program or through manual intervention, the calibration transmitter shown as $T_1$ in FIG. 1, is caused to transmit. The resultant phase measurements, which represent the apparent azimuths at the receivers, are collected from the several receiving sites. These apparent azimuths differ from the known true azimuths from the respective receiver sites to the transmitter $T_1$, the coordinates of all of which ar known. The known true azimuths are retained in the stored program and are compared to the received apparent azimuths and the stored program is adjusted to calculate the apparent azimuths correctly.

It is obvious that a calibration frequency may be chosen such that azimuthal errors due to system drift (i.e., due to temperature changes or component aging) will be as small as desired. It is also obvious that a sudden change from one calibration cycle to another readily identifies a catastrophic failure and permits quick initiation of repairs and further provides means for the system to identify and ignore defective data. In this manner, continuous calibration and updating of the system is provided as well as means for determining failure.

The second routine 2 mentioned above for obtaining numeric constants for the system is essentially accomplished at the start up or initialization of the system. During this process, a vehicle is moved from position to position at which its location is known. Transmissions are issued and the resulting azimuth determinations compared to the actual location of the vehicles. The stored program is initially adjusted or calibrated to reduce the error to a minimum over a plurality of such known transmission sites. It will not be possible to reduce the error between actual and true azimuths to zero in all cases. Accordingly, during the initialization process, data pairs representing apparent and actual azimuths will be entered into the computer program for a large number of known receiving sites which will be utilized in the data processing to determine the location of vehicles of unknown coordinates.

In routine 3 mentioned above, the coordinate location of a vehicle issuing a transmission is determined. This coordinate location is affected by what is known as multipath. As indicated in FIG. 1, multipath is the occurrence of reflected signals arriving at the receiving site at an azimuth angle differing from the true azimuth from the transmissing vehicle. This is indicated by the direct line of transmission 12 between the vehicle and the receiving station $R_3$ versus the reflected signal 13–14 representing the multipath propagation.

The transmitted electromatic field, in the presence of multipath transmission, has a fine structure (varying with distances comparable to a wave length) which makes impractical an exact mapping of the area served by the location system. The analysis performed on the azimuth readings from the various receivers, which presents no practical difficulties to one skilled in the art, provides certain statistical information in numeric form to the stored program. Of particular importance are, for each receiving site and each apparent azimuth (more exactly, each incremental range of apparent azimuth) the mean value and the variance of the true azimuth. A description of the electromagnetic field in terms of these statistical properties is stored in the computer program and utilized in the processing of the data.

The simpliest processing of signals received from a vehicle, whose location is to be determined, involves two adjustments to the receiving site raw phase measurements. The first is an adjustment derived from the calibration data, which eliminates certain fixed errors and errors due to circuit drift and the second is an adjusment derived from the initialization data which converts the apparent azimuths to most probable estimates of the true azimuths. The computer processing the data is appropriately programed to perform both of these adjustments to the data prior to further processing of the data.

The azimuths of the unknown location of the vehicle issuing the transmission relative to the known receiving site locations are now used to determine the unknown location by using triangulation techniques. It is to be understood that the greatest accuracy from triangulation results from the use of receiving sites which are close to the unknown location and conversely ignoring the data from sites from the unknown location. In accordance with this, the first step in the determination of the unknown location is to determine the approximate location of the vehicle and from that location select a subset of receiving sites to be used in subsequent processing. Th approximate location is simply determined by triangulating the unknown location using two arbitrarily chosen receiving sites subject to the condition that their azimuths do not intersect at a small acute angle.

The data processor is programed to identify a subset of receiver sites usable for best coordinate determination based upon the approximate location. These receiver subsets are identified and the data from them utilized in the further determination of the coordinates of the unknown vehicle location and the remainder of the data from the other receivers is ignored.

The data from the selected subset of receiver sites is used to determine all possible indications of location derivable from the subset. These locations so determined are averaged to obtain the final value of the location. A preferred method of averaging the locations is to average separately the corresponding rectangular coordinates. The final average value has a strong tendency to converge on the true location of the vehicle.

Once the final coordinate location has been determined, the location of the vehicle issuing the transmission is displayed in a location display unit 48. The location display unit may be positioned at a clearly visible point at the dispatching station. In this manner, the dispatcher will have an immediate display of the location of the vehicle with whom he is communicating.

The process just described is a relatively simple utilization of the structure of the invention. More sophisticated statistical methods may be employed to further increase the accuracy of the system. For example, the averaging process may be enhanced by utilization of the variances previously stored to alter the "weight" of the individual locations in the averaging process.

The data processor utilized in the determination of the coordinates, as earlier indicated, may be a special purpose computer or may also be a general purpose computer. In the case of the general purpose computer, the various steps utilized in processing the data may be incorporated in the program for the computer. One of ordinary skill in the art could generate such a program to handle the data and, therefore, a detailed description of the computer program is not deemed necessary for the purposes of the invention. Additionally, inasmuch as computers are well known in the art, it is not deemed necessary to describe either the general purpose or special purpose computer of the type which is capable of processing the data in accordance with the invention.

In overall, the invention has been described with respect to particular embodiments thereof as shown in the drawings. However, other variations and modifications of the invention will become apparent to those skilled in the art from the detailed description which has now been made. It is, therefore, to be understood that no limitation as to the scope of the invention was intended by the specific embodiments described.

I claim:

1. Signal processing apparatus for processing first and second input signals differing in phase and having common frequency variations to remove the frequency variations for subsequent improved phase measurements comprising:
   a first mixing device having the first input signal as its first input;
   signal generating means providing a signal as the first output of the signal processing apparatus and the second input to the first mixing device; and
   a second mixing device having its first input the difference output from the first mixer and its second input the second input signal to provide a second difference output of the signal processing device in which the frequency variations are removed and which differs from the first output only by the initial phase difference.

2. A phase detector for processing first and second input signals differing in phase and providing a numeric output linearly related to the phase difference comprising:
   first gate generating means having the first and second input signals as its inputs and providing a first gating signal of duration indicative of the phase difference of the first and seond input signals;
   first counter means responsive to the presence of the first gate signal to provide a numeric count linearly related to the phase difference between the first and second input signals; and
   monitoring means responsive to the continued presence of the first and second input signals at or above a usable value to provide a monitoring signal to continue the detector operation and responsive to the occurrence of the first or second input signals below a usable value to restart the phase detector sequence.

3. A phase detector for processing first and second input signals differing in phase and providing a numeric output linearly related to the phase difference comprising:
   first gate generating means having the first and second input signals as its inputs and providing a first gating signal of duration indicative of the phase difference of the first and second input signals;
   first counter means responsive to the presence of the first gating signal to provide a numeric count linearly related to the phase difference between the first and second input signals;
   delay means delaying the second input signal a predetermined phase shift;
   third gate generating means having the first input signal and second delayed input signal as its inputs and providing a third gating signal of duration indicative of the phase difference of the first and second delayed input signals;
   second counter means responsive to the presence of the third gate signal to provide a numeric count linearly related to the phase difference between the first and second delayed inputs;
   counter offset means for correcting the count from the second counter means induced by the delay means;
   means for detecting when the first and second input signals are at or approaching a coincidence condition and providing a fourth gating signal upon the occurrence of a coincidence condition; and
   counter gate means responsive to the presence or absence of the fourth gating signal to select the count in either the first or second counter means as the phase detector output depending upon the occurrence of a coincidence condition.

\* \* \* \* \*